US012597451B2

(12) United States Patent
Tanzawa

(10) Patent No.: US 12,597,451 B2
(45) Date of Patent: Apr. 7, 2026

(54) READ CIRCUIT AND MEMORY SYSTEM

(71) Applicant: NATIONAL UNIVERSITY CORPORATION SHIZUOKA UNIVERSITY, Shizuoka (JP)

(72) Inventor: Toru Tanzawa, Hamamatsu (JP)

(73) Assignee: NATIONAL UNIVERSITY CORPORATION SHIZUOKA UNIVERSITY (JP)

( * ) Notice: Subject to any disclaimer, the term of this patent is extended or adjusted under 35 U.S.C. 154(b) by 130 days.

(21) Appl. No.: 18/568,781

(22) PCT Filed: Jun. 8, 2022

(86) PCT No.: PCT/JP2022/023179
§ 371 (c)(1),
(2) Date: Dec. 8, 2023

(87) PCT Pub. No.: WO2022/264903
PCT Pub. Date: Dec. 22, 2022

(65) Prior Publication Data
US 2024/0274166 A1 Aug. 15, 2024

(30) Foreign Application Priority Data
Jun. 14, 2021 (JP) ................................. 2021-098528

(51) Int. Cl.
*G11C 7/10* (2006.01)
*G11C 7/08* (2006.01)
(Continued)

(52) U.S. Cl.
CPC .............. *G11C 7/1069* (2013.01); *G11C 7/08* (2013.01); *G11C 7/12* (2013.01); *G11C 7/222* (2013.01)

(58) Field of Classification Search
CPC ........... G11C 7/1069; G11C 7/08; G11C 7/12; G11C 7/222
(Continued)

(56) References Cited

U.S. PATENT DOCUMENTS

| | | | | |
|---|---|---|---|---|
| 2008/0285362 A1* | 11/2008 | Kang | .................. | G11C 11/4094 |
| | | | | 365/210.1 |
| 2010/0302867 A1 | 12/2010 | Koo | .......................... | 365/185.25 |
| 2018/0233178 A1* | 8/2018 | Kang | .................. | G11C 11/1673 |

FOREIGN PATENT DOCUMENTS

| | | |
|---|---|---|
| JP | H09-185890 A | 7/1997 |
| JP | 2003-077271 A | 3/2003 |

(Continued)

OTHER PUBLICATIONS

English Translation of the International Search Report mailed Aug. 23, 2022 in corresponding International Application No. PCT/JP2022/023179.
(Continued)

*Primary Examiner* — Amir Zarabian
*Assistant Examiner* — Daniel John King
(74) *Attorney, Agent, or Firm* — OSTROLENK FABER LLP

(57) ABSTRACT

A control circuit that reads data from a memory array including a bit line electrically connecting memory cells, includes an amplification unit that includes a read line connected to the bit line, charges the bit line via the read line during a read operation of the data, and then amplifies an electric signal of the bit line at a sense node on the read line, and an inverter that determines data stored in a memory cell selected during the data read operation on the basis of a voltage of the sense node, in which the amplification unit includes switching elements, the switching element charges the bit line on the basis of power supplied from a first power supply having a first voltage, and the switching element is
(Continued)

turned on/off on the basis of power supplied from a second power supply having a second voltage higher than the first voltage.

7 Claims, 7 Drawing Sheets

(51) Int. Cl.
  *G11C 7/12* (2006.01)
  *G11C 7/22* (2006.01)
(58) Field of Classification Search
  USPC ................................................. 365/189.011
  See application file for complete search history.

(56) References Cited

FOREIGN PATENT DOCUMENTS

| | | | |
|---|---|---|---|
| JP | 2004-362695 | A | 12/2004 |
| JP | 2011-065690 | A | 3/2011 |
| JP | 2011-076678 | A | 4/2011 |
| JP | 2015-049928 | A | 3/2015 |
| JP | 2020-205130 | A | 12/2020 |

OTHER PUBLICATIONS

English translation of the International Preliminary Report on Patentability (IPRP) (Chapter 1 or II of the PCT Treaty) mailed Dec. 14, 2023 with a Notification from the International Bureau (Form PCT/IB/338) in corresponding International Application No. PCT/JP2022/023179.

C. Siau et al.: "A 512Gb 3-bit/Cell 3D Flash Memory on 128-Wordline Layer with 132 MB/s Write Performance Featuring Circuit-Under-Array Technology", 2019 IEEE International Solid-State Circuits Conference, 2019.

* cited by examiner (a) φ1

(b) φ2

(c) VDDBL (a)  VDDBL ─────────────────────────────── 2V(VDDR)

(b)  $V_{WL}$                              1V

0V (c)  PASS (d)  PREB 0.5V("0")
(e)  $V_{BL}$                             0.4V("1")

(f)  $V_{SN}$                             2V("0")

0.4V("1")

(g)  SNS

2V("1")
(h)  $D_{out}$
                                          0V("0")

READ CIRCUIT AND MEMORY SYSTEM

CROSS-REFERENCE TO RELATED APPLICATIONS

The present application is a 35 U.S.C. §§ 371 national stage application of International Application No. PCT/JP2022/023179, filed Jun. 8, 2022, which claims priority to Japanese Patent Application No. 2021-098528, filed Jun. 14, 2021, the contents of which are incorporated herein by reference.

TECHNICAL FIELD

The present disclosure relates to a read circuit and a memory system.

BACKGROUND ART

In recent years, a large-capacity nonvolatile semiconductor memory such as a NAND flash memory has been used as a storage element incorporated in a storage medium such as a memory card or a solid state drive (SSD). In the semiconductor memory, since data of a large number of memory cells is read at the same time, power consumption tends to increase as the number of memory cells to be read at the same time increases, which may cause a problem in system design. Conventionally, a technique of preventing a leakage current in a NAND flash memory to reduce power consumption (see Patent Literatures 1 and 2 below), a technique of reducing power consumption in a case where a plurality of chips of a NAND flash memory is used (see Non Patent Literature 1 below), and the like are known.

CITATION LIST

Patent Literature

Patent Literature 1: Japanese Unexamined Patent Publication No. 2011-76678
Patent Literature 2: Japanese Unexamined Patent Publication No. 2004-362695

Non Patent Literature

Non Patent Literature 1: C. Siau et al., "A 512 Gb 3-bit/Cell 3D Flash Memory on 128-Wordline-Layer with 132 MB/s Write Performance Featuring Circuit-Under-Array Technology", 2019 IEEE International Solid-State Circuits Conference, 2019.

SUMMARY OF INVENTION

Technical Problem

In recent years, it has become increasingly important to reduce the power consumption of the semiconductor memory with the increase in capacity. In the conventional technique as described above, there is room for improvement from the viewpoint of reducing the power consumption consumed by the read operation itself of data from the memory cell.

The present invention has been made in view of the above problem, and an object thereof is to provide a read circuit and a memory system capable of efficiently reducing power consumption in a read operation of data from a memory cell.

Solution to Problem

In order to solve the above problem, a read circuit according to an embodiment of the present disclosure is a read circuit that reads data from a memory array including a plurality of bit lines, each of the bit lines being a line-shaped wiring section electrically connecting a plurality of memory cells, the read circuit including: a first amplification unit including a read line, the read line being a line-shaped wiring section electrically connected to the bit line, and configured to amplify an electric signal of the bit line at a voltage of a sense node on the read line after charging the bit line via the read line during a read operation of the data; and a second amplification unit configured to output a determination signal that determines data stored in the memory cells connected to the bit line and selected during the read operation of the data based on a voltage of the sense node, in which the first amplification unit includes a first switching element that is electrically connected between the bit line and the read line and is turned on/off according to an electric signal of the bit line, and a second switching element that is turned on/off a connection between a power supply and the read line, the second switching element charges the bit line based on power supplied from a first power supply having a first voltage, and the first switching element is turned on/off based on power supplied from a second power supply having a second voltage higher than the first voltage.

Alternatively, a memory system according to another aspect of the present disclosure includes the above-described read circuit and the memory array including the plurality of memory cells electrically connected to the read circuit via a plurality of the bit lines.

According to the one aspect or the other aspect, when data is read from a memory cell selected from among the plurality of memory cells electrically connected to the bit line, the first amplification unit charges the bit line via the read line on the basis of power supplied from the first power supply having the first voltage. In addition, by the first amplification unit, the electric signal of the bit line is amplified at the sense node on the read line. Moreover, the second amplification unit determines the data stored in the memory cell selected on the basis of the voltage of the sense node and outputs it as a determination signal. At this time, since the voltage of the first power supply used for charging the bit line is lower than the voltage of the power supply used for turning on/off the connection between the bit line and the read line, it is possible to reduce the power consumption consumed when charging the bit line until a storage state of the data in the memory cell becomes determinable. As a result, the power consumption in the read operation of the data from the memory cell can be efficiently reduced.

Advantageous Effects of Invention

According to the present disclosure, it is possible to efficiently reduce power consumption in a read operation of data from a memory cell.

DESCRIPTION OF EMBODIMENTS

Hereinafter, a preferred embodiment of a memory system according to the present disclosure will be described in detail with reference to the drawings. Note that, in the description of the drawings, the same or corresponding portions are denoted by the same reference signs, and redundant description is omitted.

Figure 1:
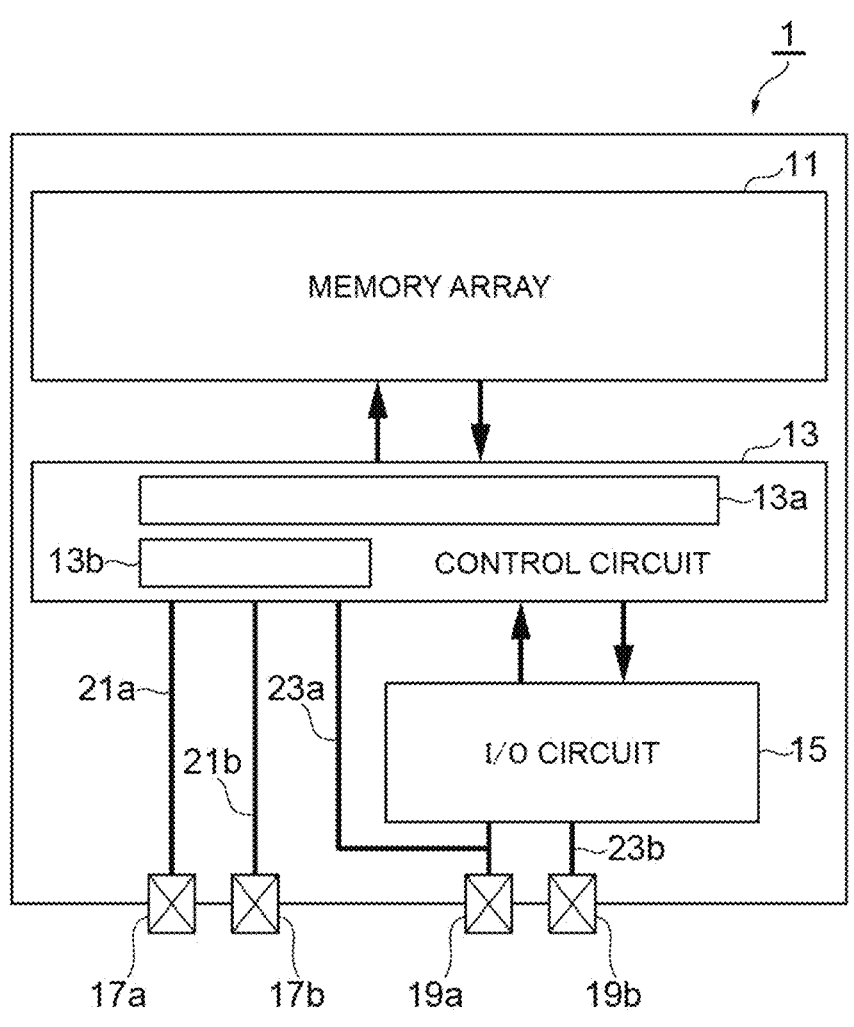
FIG. 1 is a diagram illustrating a schematic configuration of a NAND flash memory that is a memory system according to a preferred embodiment of the present disclosure.

As illustrated in FIG. 1, a NAND flash memory 1, which is a memory system according to a preferred embodiment of the present disclosure, is used as a memory device that stores data in combination with an external memory controller (not illustrated). The NAND flash memory 1 executes a read operation of data and a write operation of data under the control of a memory controller.

The NAND flash memory 1 is a semiconductor memory in which a plurality of transistors (metal oxide semiconductor field effect transistors (MOSFETs)) is mounted on a semiconductor chip, and includes a memory array 11, a control circuit (read circuit) 13, and an I/O circuit (input/output circuit) 15. The memory array 11, the control circuit 13, and the I/O circuit 15 are formed on the same semiconductor chip.

The memory array 11 is configured by arranging a plurality of memory cells configured by transistors (MOSFETs) in a two-dimensional array, and has a function of storing binary data in each of the memory cells. Specifically, the memory cell can be set to two states of a state in which a threshold voltage is high and a state in which the threshold voltage is low according to a storage state of the binary data by a write operation by the control circuit 13. The memory array 11 includes a plurality of (for example, about 128,000) sub-arrays in which a plurality of (for example, 1024) memory cells are arranged one-dimensionally (linearly).

The control circuit 13 is a circuit unit having a function of a read operation of data from the memory array 11 and a function of a write operation of data to the memory array 11. Specifically, the memory array 11 includes a main circuit unit 13a that executes the read operation of data and the write operation of data, and a switching circuit 13b for switching a route for supplying power to the main circuit unit 13a.

The I/O circuit 15 is a circuit unit having a function of relaying a control signal and data transmitted and received between an external memory controller and the control circuit 13 via a communication bus (not illustrated). That is, the I/O circuit 15 relays, to the control circuit 13, a control signal transmitted from an external memory controller for controlling reading of data and writing of data. Furthermore, the I/O circuit 15 relays data output at the time of the data read operation from the control circuit 13 to an external memory controller, and receives data to be written to the memory array 11 from the external memory controller and relays the received data to the control circuit 13.

In addition, the NAND flash memory 1 includes four power supply terminals 17a, 17b, 19a, and 19b that receive power supply from the outside. The power supply terminals 19a and 19b are connected to an external first power supply that generates a first voltage VDDQ, the power supply terminal 19b is set to a ground potential VSSQ (=0 V), and the power supply terminal 19a is applied with the first voltage VDDQ with reference to the ground potential VSSQ of the power supply terminal 19b. A value of the first voltage VDDQ may be set to any value, but is 1.2 V in the present embodiment. The power supply terminals 17a and 17b are connected to a second power supply that generates a second voltage VDD higher than the first voltage VDDQ, the power supply terminal 17b is set to a ground potential VSS (=0 V), and the power supply terminal 17a is applied with the second voltage VDD with reference to the ground potential VSS of the power supply terminal 17b. Any value can be set as a value of the second voltage VDD, but in the present embodiment, the value is in a range of 2.5 V to 3.3 V.

The power supply terminals 17a and 17b are electrically connected to the control circuit 13 via wirings 21a and 21b, respectively, and are terminals for transmitting power supplied from the second power supply to the control circuit 13. Furthermore, the power supply terminal 19a is electrically connected to both the control circuit 13 and the I/O circuit 15 via a wiring 23a branching into two, and the power supply terminal 19b is electrically connected to the I/O circuit 15 via a wiring 23b. In such a configuration, the control circuit 13 and the I/O circuit 15 are connected in parallel to the first power supply, and both circuits can be simultaneously powered by the first power supply.

In the present embodiment, since the I/O circuit 15 incorporates a transistor having a lower driving voltage and a faster operation than the control circuit 13, it is configured to operate by power supplied from the first power supply having a relatively low voltage. On the other hand, the control circuit 13 is configured to operate while switching power supplied from the first power supply and power supplied from the second power supply having a relatively high voltage at the time of the read operation in order to maintain the reliability of the read operation of data from the memory array 11 (details will be described later).

Figure 2:
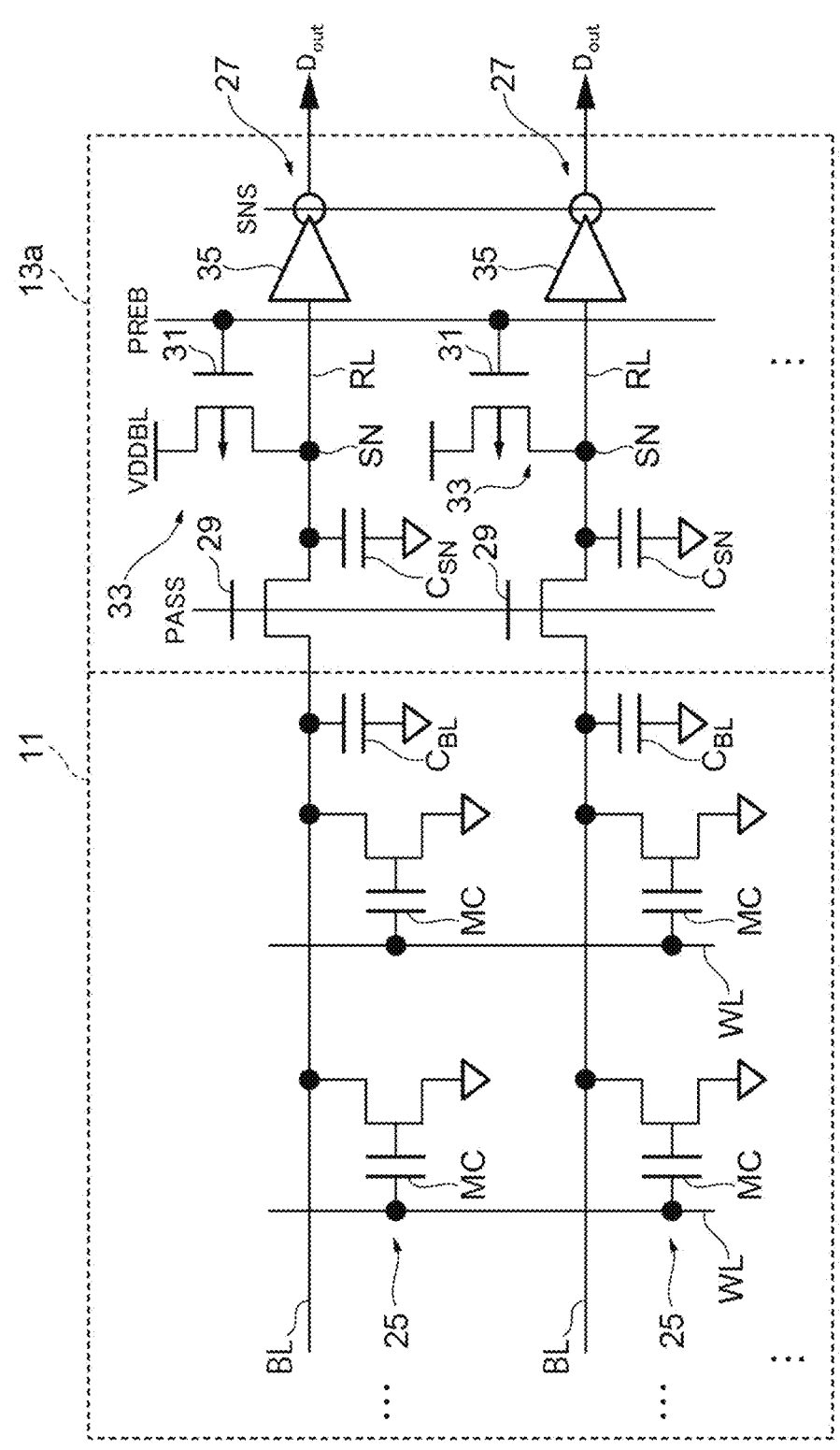
FIG. 2 is a circuit diagram illustrating a configuration of a memory array 11 and a main circuit unit 13*a* in FIG. 1.
Figure 3:
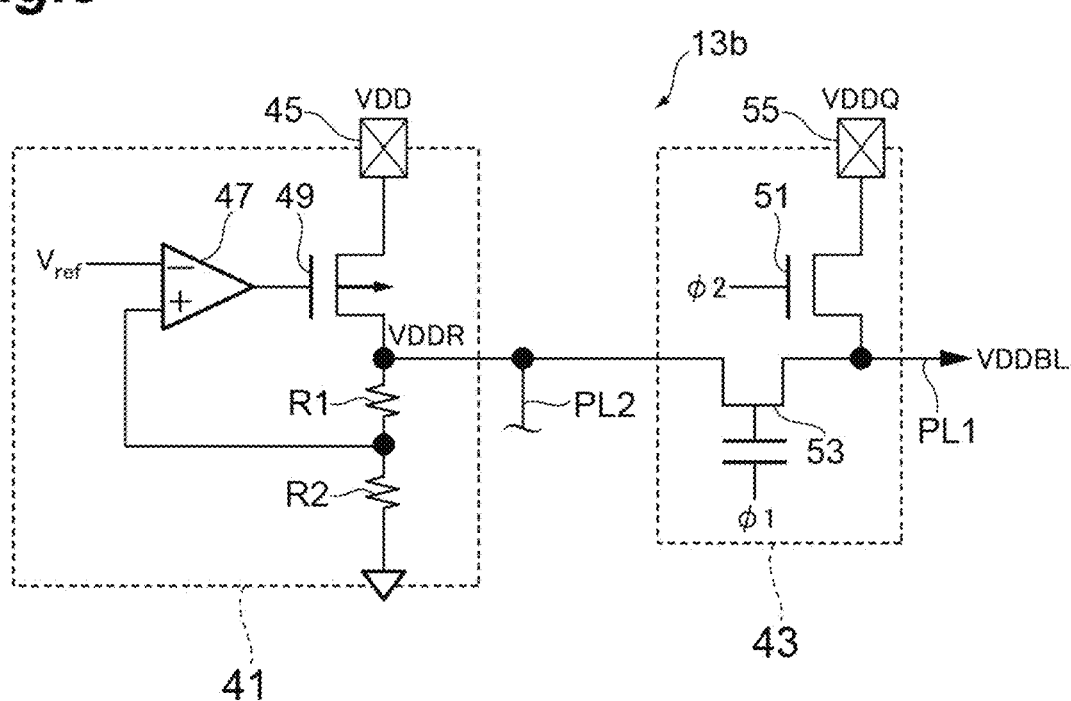
FIG. 3 is a circuit diagram illustrating a configuration of a switching circuit 13b in FIG. 1.

A detailed configuration of a main part of the NAND flash memory 1 will be described with reference to FIGS. 2 and 3. FIG. 2 is a circuit diagram illustrating a configuration of the memory array 11 and the main circuit unit 13a of the control circuit 13, and FIG. 3 is a circuit diagram illustrating a configuration of the switching circuit 13b of the control circuit 13.

As illustrated in FIG. 2, the memory array 11 includes a plurality of sub-arrays 25 including a plurality of memory cells MC arranged one-dimensionally and bit lines BL which are line-shaped wiring sections electrically connecting the plurality of memory cells MC. The plurality of sub-arrays 25 are configured such that the plurality of memory cells MC connected by the bit lines BL are arranged along the same direction, and as a result, the plurality of memory cells are two-dimensionally arranged. In each of the memory cells MC constituting the memory array 11, the source is set to the ground potential, and the drain is electrically connected to the bit line BL. Note that the bit line BL is formed on the semiconductor chip together with the plurality of memory cells MC, and inevitably has a parasitic capacitance $C_{BL}$ of a finite size. A size of the parasitic capacitance $C_{BL}$ is, for example, on the order of several pF.

Furthermore, the gate of one memory cell MC in each of the sub-arrays 25 is electrically connected to a word line WL, which is a wiring section extending in a line shape in a direction intersecting the bit line BL, together with the gates of the adjacent memory cells MC of the other sub-arrays 25. The word line WL is provided to transmit a selection signal $V_{WL}$ of a positive potential for selecting one memory cell MC in each sub-array 25 during a read operation of data. That is, the memory cell MC to which the selection signal $V_{WL}$ of the positive potential is applied to the gate via the word line WL is switched to on in a state where "1" of the binary data is stored and the threshold voltage is low, and is kept off in a state where "0" of the binary data is stored and the threshold voltage is high.

The main circuit unit 13a is a circuit unit that is electrically connected to ends of the bit lines BL of the plurality of sub-arrays 25 and reads data from the plurality of memory cells MC selected by the selection signal $V_{WL}$. That is, the main circuit unit 13a includes a plurality of sub-circuit units 27 for each of the plurality of sub-arrays 25, and each of the sub-circuit units 27 includes a read line RL which is a line-shaped wiring section, an amplification unit (first amplification unit) 33 including a switching element (first switching element) 29 and a switching element (second switching element) 31, and an inverter (second amplification unit) 35. Note that the read line RL is formed on a semiconductor chip similarly to the bit line BL, and inevitably has a parasitic capacitance $C_{SN}$ of a finite size. However, since a length of the read line RL is shorter than that of the bit line BL, a magnitude (F) of the parasitic capacitance $C_{SN}$ is much smaller than a magnitude (F) of the parasitic capacitance $C_{BL}$, for example, smaller by one digit or more.

The switching element 29 is an N-channel MOSFET, and one end of the read line RL is electrically connected to an end of the bit line BL via the switching element 29. Specifically, the source of the switching element 29 is electrically connected to the end of the bit line BL, and the drain thereof is electrically connected to one end of the read line RL. The switching element 31 is a P-channel MOSFET, a drain of which is electrically connected to a sense node SN which is a contact on the bit line BL, and a source of which is electrically connected to a power supply selected from the first power supply or the second power supply via the switching circuit 13b.

The switching element 29 is configured such that a control signal PASS of a positive potential is applied to the gate at the time of the read operation of data, and operates to be turned on/off according to the potential of the bit line BL. The control signal PASS is applied to the gate of the switching element 29 on the basis of power supplied from the second power supply having the second voltage VDD. The "on/off of the switching element 29" mentioned here means the following in more detail. The "on" indicates a state in which the switching element 29 causes a current $I_{BL1}$ to flow in a state in which the memory cell MC of the data "1" is connected to the bit line BL. The "off" indicates a state in which the switching element 29 causes a current $I_{BL0}$ to flow in a state in which the memory cell MC of data "0" is connected to the bit line BL. Here, the current $I_{BL1}$ is larger than the current $I_{BL0}$. The current $I_{BL1}$ is equal to a current $I_{cell1}$ flowing from the memory cell MC of data "1" when the voltages of the word line WL, the bit line BL, and the read line RL reach a steady state. The current $I_{BL0}$ is equal to a current $I_{cell0}$ flowing from the memory cell MC of data "0" when the voltages of the word line WL, the bit line BL, and the read line RL reach a steady state. Here, the current $I_{cell1}$ is larger than the current $I_{cell0}$. Furthermore, the switching element 31 is configured such that a control signal PREB is applied to the gate at the time of the read operation of data, and operates to turn on/off a connection between the first power supply or the second power supply and the read line RL.

By the functions of the switching elements 29 and 31, when the control signal PASS is set to the positive potential after the start of the read operation of data and the control signal PREB is set to a low potential lower than the source potential of the switching element 31, the switching elements 29 and 31 are turned on, and a charging current is supplied to the read line RL and the bit line BL via the switching element 31, the read line RL, and the switching element 29 (charging function by the amplification unit 33). Thereafter, when the control signal PASS is maintained at the positive potential and the control signal PREB is set to a high potential close to the source potential of the switching element 31, the switching element 31 is turned off, and the potential (electric signal) of the bit line BL is amplified at the sense node SN on the read line RL (amplification function by the amplification unit 33). In other words, the amplification unit 33 has a function of amplifying the current $I_{BL1}$ or the current $I_{BL0}$ (electric signal) according to the data of the memory cell MC flowing through the bit line BL.

Specifically, the threshold voltage and the potential of the control signal PASS are set such that the switching element 29 is turned on/off according to the potential of the bit line BL that changes corresponding to the storage state of data of the memory cell MC connected to the bit line BL. More specifically, in a state where data "0" is stored in the selected memory cell MC and the memory cell MC is turned off, the switching element 29 operates as a source follower, is turned on until the bit line BL reaches a potential (for example, 0.5 V) obtained by subtracting the threshold voltage from the control signal PASS by charging, and is turned off at a timing when the bit line BL reaches the voltage. As a result, a potential $V_{BL}$ of the bit line BL is stabilized at the potential obtained by subtracting the threshold voltage from the control signal PASS. On the other hand, in a state where the data "1" is stored in the selected memory cell MC and the memory cell MC is turned on, the potential $V_{BL}$ of the bit line BL is stabilized at a potential (for example, 0.4 V) lower than or equal to the potential obtained by subtracting the threshold voltage from the control signal PASS due to the charge current flowing through the memory cell MC, and thus the switching element 29 maintains the on state.

Furthermore, the switching elements 29 and 31 operate to amplify the potential $V_{BL}$ of the bit line BL when the control signal PREB is set to the high potential at the timing when the potential of the bit line BL is stabilized at two types of potentials by the above function. That is, when the potential $V_{BL}$ of the bit line BL is stabilized at the high potential, the switching elements 29 and 31 are turned off, and the charge accumulated in the parasitic capacitance $C_{SN}$ of the read line RL is maintained, so that a potential $V_{SN}$ of the sense node SN is maintained at a high potential (for example, 2 V). On the other hand, when the potential $V_{BL}$ of the bit line BL is stabilized at the low potential, the switching element 29 is turned on, the switching element 31 is turned off, and the charge accumulated in the parasitic capacitance $C_{SN}$ of the read line RL is discharged through the bit line BL, so that the potential $V_{SN}$ of the sense node SN decreases to a low potential (for example, 0.4 V).

The inverter 35 has an input electrically connected to the other end of the read line RL, senses (detects) the potential $V_{SN}$ of the sense node SN on the read line RL, and compares the potential $V_{SN}$ with a predetermined threshold voltage to determine data stored in the memory cell MC connected to the bit line BL corresponding to the sub-circuit unit 27 to which the inverter 35 belongs. Moreover, the inverter 35 outputs a data signal (determination signal) $D_{OUT}$ indicating a determination result. That is, in a case where the potential $V_{SN}$ of the sense node SN is high (for example, 2 V), the inverter 35 determines that the potential $V_{SN}$ is higher than the predetermined threshold voltage (for example, 1.2 V), and outputs a low-level (for example, 0 V) data signal $D_{OUT}$ indicating data "0". On the other hand, in a case where the potential $V_{SN}$ of the sense node SN is low (for example, 0.4 V), the inverter 35 determines that the potential $V_{SN}$ is lower than the predetermined threshold voltage (for example, 1.2 V), and outputs a high-level (for example, 2 V) data signal $D_{OUT}$ indicating the data "1". At this time, the inverter 35 activates the above-described determination operation at the timing when the input control signal SNS is set to the high level indicating an enable state, and specifically, activates the determination operation at the timing after the control signal PREB is set to the high potential and the switching element 31 is turned off.

Referring now to FIG. 3, the function of the switching circuit 13b of the control circuit 13 is described.

The switching circuit 13b has a function of switching a supply source of a potential VDDBL provided to a source for driving the switching element 31 of the main circuit unit 13a between the first power supply and the second power supply. The switching circuit 13b includes a power supply line PL1 electrically connected to the source of the switching element 31, a power supply line PL2 for supplying power to elements other than the switching element 31 in the control circuit 13, a linear regulator 41 that is electrically connected to the second power supply via the power supply terminal 17a and converts the second voltage into a predetermined voltage and outputs the predetermined voltage, and a switching circuit 43 that is electrically connected to the first power supply via the power supply terminal 19a and switches a connection between the output of the first power supply and the output of the linear regulator 41, and the power supply line PL1.

The linear regulator 41 includes an input terminal 45 to which the second voltage VDD is supplied from the second power supply, an error amplifier 47, a control transistor 49, and resistance elements R1 and R2. The control transistor 49 is a P-channel MOSFET, and has a source connected to the input terminal 45, a gate connected to an output of the error amplifier 47, and a drain serving as an output terminal of the linear regulator 41. The resistance elements R1 and R2 are connected in series between the drain of the control transistor 49 and the ground, and generate a voltage obtained by dividing an output voltage of the linear regulator 41. The error amplifier 47 is a differential amplifier, a preset reference voltage Vref is input to an inverting input thereof, and a node between the two resistance elements R1 and R2 is connected to a non-inverting input thereof. The error amplifier 47 controls the on-resistance of the control transistor 49 so that an output voltage VDDR of the linear regulator 41 becomes a predetermined voltage (for example, 2.0 V) set by the reference voltage Vref. The output of the linear regulator 41 is electrically connected to the power supply line PL2 and is electrically connected to the power supply line PL1 via the switching circuit 43.

The switching circuit 43 includes an input terminal 55 to which the first voltage VDDQ is supplied from the first power supply, and switching elements 51 and 53 which are N-channel MOSFETs. The switching element 51 has a function of turning on/off a connection between the input terminal 55 and the power supply line PL1 according to a control signal φ2, and a drain thereof is electrically connected to the input terminal 55, a source thereof is electrically connected to the power supply line PL1, and the control signal φ2 is applied to a gate thereof. The switching element 53 has a function of turning on/off a connection between an output of the linear regulator 41 and the power supply line PL1 according to a control signal φ1, a drain thereof is electrically connected to the output of the linear regulator 41, a source thereof is electrically connected to the power supply line PL1, and the control signal φ1 is applied to a gate thereof.

Figure 4:
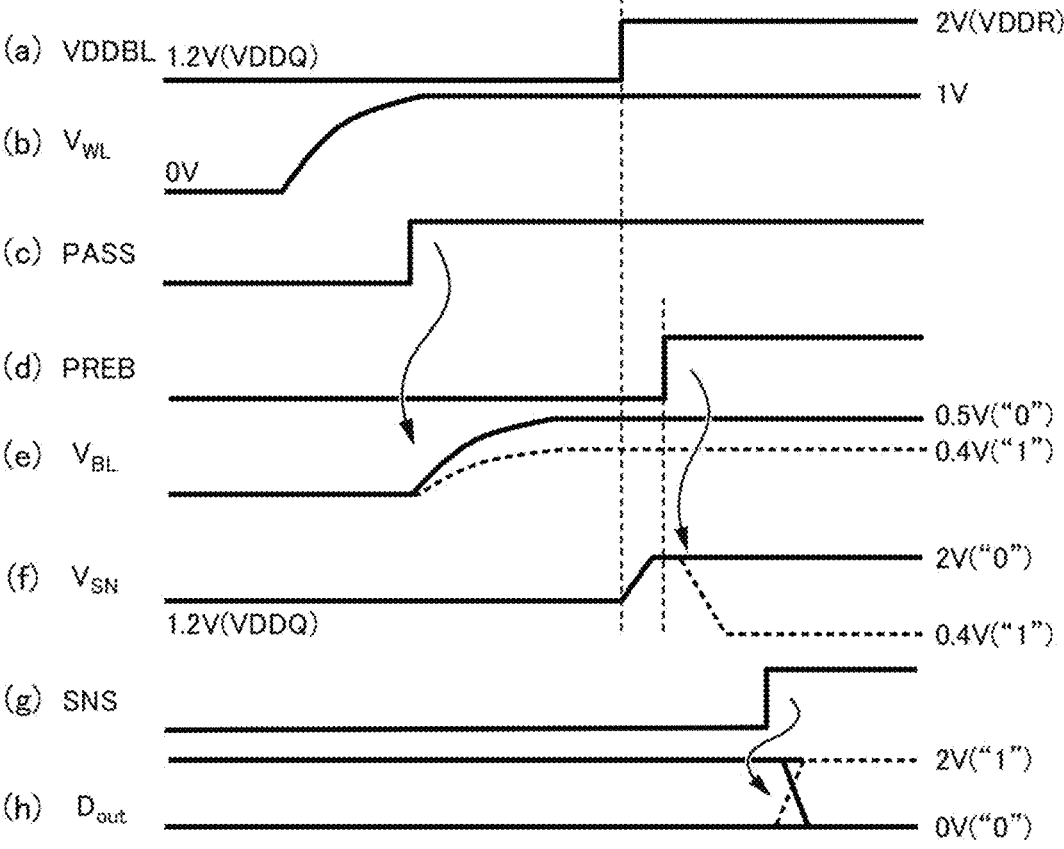
FIG. 4 is a timing chart illustrating changes in various voltage signals in the memory array 11 and the main circuit unit 13a at the time of a read operation of data.
Figure 5:
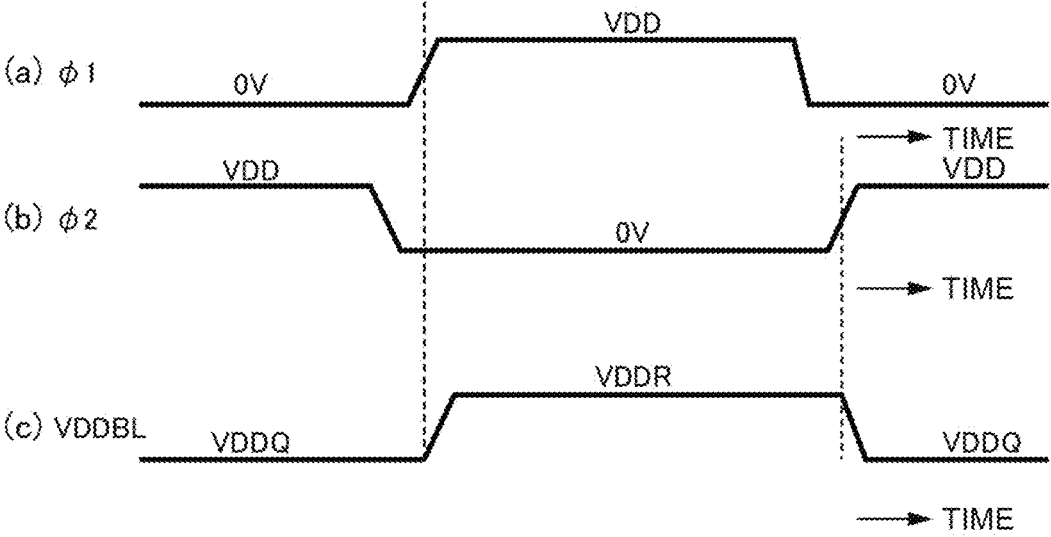
FIG. 5 is a timing chart illustrating changes in various voltage signals in the switching circuit 13b at the time of a read operation of data.

Next, an operation procedure at the time of a data read operation of the NAND flash memory 1 will be described with reference to FIGS. 4 and 5. FIG. 4 is a timing chart illustrating changes in various voltage signals in the memory array 11 and the main circuit unit 13a at the time of the read operation of data, and part (a) illustrates a temporal change of the potential VDDBL, part (b) illustrates a temporal change of the selection signal $V_{WL}$, part (c) illustrates a temporal change of the control signal PASS, part (d) illustrates a temporal change of the control signal PREB, part (e) illustrates a temporal change of the potential $V_{BL}$, part (f) illustrates a temporal change of the potential $V_{SN}$, part (g) illustrates a temporal change of the control signal SNS, and part (h) illustrates a temporal change of the data signal $D_{OUT}$. FIG. 5 is a timing chart illustrating changes in various voltage signals in the switching circuit 13b during the read operation of data, in which part (a) illustrates a temporal change in the control signal φ1, part (b) illustrates a temporal change in the control signal φ2, and part (c) illustrates a temporal change in the potential VDDBL.

As illustrated in FIG. 4, at an initial stage after the start of the read operation of data, the potential VDDBL is set to 1.2 V which is the first voltage VDDQ (part (a) of FIG. 4) by the operation of the switching circuit 13b, and in a state where the control signals PASS and PREB are maintained at low potentials (parts (c) and (d) of FIG. 4), thereafter, the selection signal $V_{WL}$ rises from 0 V to 1 V, whereby the memory cell MC is selected (part (b) of FIG. 4). Thereafter, when the control signal PASS rises to a high potential, the charging function by the main circuit unit 13a is enabled, and the potential $V_{BL}$ of the bit line BL rises to two types of potentials (0.5 V or 0.4 V) according to the storage state of data of the selected memory cell MC (part (e) of FIG. 4). Here, the control signal PASS is generated on the basis of power supplied from the second power supply having the second voltage VDD, and its high potential is set higher than the first voltage VDDQ. Next, at the timing when the potential $V_{BL}$ of the bit line BL is stabilized, the potential VDDBL rises from 1.2 V that is the first voltage VDDQ to 2 V that is the output voltage VDDR of the linear regulator 41 by the operation of the switching circuit 13b, and accordingly, the potential $V_{SN}$ of the sense node SN also rises to 2 V that is the output voltage VDDR (part (f) of FIG. 4). Moreover, thereafter, the control signal PREB is set to a high potential, whereby the amplification function by the main circuit unit 13a is enabled, and the potential $V_{SN}$ of the sense node SN is amplified to two types of potentials (2 V or 0.4 V) according to the potential $V_{BL}$ of the bit line BL. Next, at the timing when the control signal SNS is set to the high level, the potential $V_{SN}$ of the sense node SN is sensed in the main circuit unit 13a, and the data signal $D_{OUT}$ indicating the storage state of the data of the memory cell MC is output (parts (g) and (h) in FIG. 4). By operating in this manner, a difference $\Delta V_{BL}$ (0.1 V in the present embodiment) of the potential $V_{BL}$ due to the storage state of the data of the memory cell MC is amplified to a difference $\Delta V_{SN}$ (1.6 V in the present embodiment) of the two types of potentials $V_{SN}$ of the sense node SN by the amplification function by the main circuit unit 13a, thereby increasing a sense margin. However, the main circuit unit 13a may be configured to have an amplification function that satisfies a relationship of $\Delta V_{BL} < \Delta V_{SN}$.

As illustrated in FIG. 5, in the initial stage after the start of the read operation of data, the control signal φ1 is set to the low level (0 V) and the control signal φ2 is set to the high level (VDD), so that the first voltage VDDQ is supplied to the switching element 31 of the main circuit unit 13a as the potential VDDBL. Thereafter, when the control signal φ1 is set to the high level (VDD) and the control signal φ2 is set to the low level (0 V) at the timing when the potential $V_{BL}$ of the bit line BL is stabilized by charging, the voltage VDDR based on the second voltage VDD is supplied as the potential VDDBL to the switching element 31 of the main circuit unit 13a. Thereafter, the control signals φ1 and φ2 are returned to the initial states at the timing when the read operation of data is completed.

The operational effects of the NAND flash memory 1 of the above-described embodiment will be described.

According to the control circuit 13 according to the present embodiment, when data is read from the memory cell MC selected from the plurality of memory cells MC electrically connected to the bit line BL, the bit line BL is first charged by the amplification unit 33 via the read line RL on the basis of power supplied from the first power supply having the first voltage VDDQ. Thereafter, the potential $V_{BL}$ of the bit line BL is amplified by the amplification unit 33 at the sense node SN on the read line RL on the basis of power supplied from the second power supply having the second voltage VDD higher than the first voltage. Moreover, the inverter 35 determines data stored in the memory cell MC selected on the basis of the potential $V_{SN}$ of the sense node SN, so that a determination result is output as the data signal $D_{OUT}$. As a result, it is possible to reduce the power consumption consumed when charging the bit line BL until the storage state of the data of the memory cell MC can be determined, and it is possible to amplify the potential $V_{BL}$ after charging of the bit line BL with a sufficient drive voltage, and as a result, it is also possible to stabilize the read operation of data. That is, the potential $V_{SN}$ of the sense node SN can be amplified to two voltages having a large potential difference according to the storage state of the data, and the determination operation using the threshold by the inverter 35 based on the two voltages is stabilized. As a result, it is possible to efficiently reduce the power consumption in the read operation while improving the reliability of the read operation of the data from the memory cell MC.

Here, in the present embodiment, the parasitic capacitance $C_{SN}$ of the read line RL is set to be smaller than the parasitic capacitance $C_{BL}$ of the bit line BL by one digit. In this case, the power consumption at the time of charging the bit line BL in the control circuit 13 can be effectively reduced according to the decrease in the first voltage VDDQ. As a result, the power consumption in the read operation of data of the control circuit 13 can be more efficiently reduced.

Figure 6:
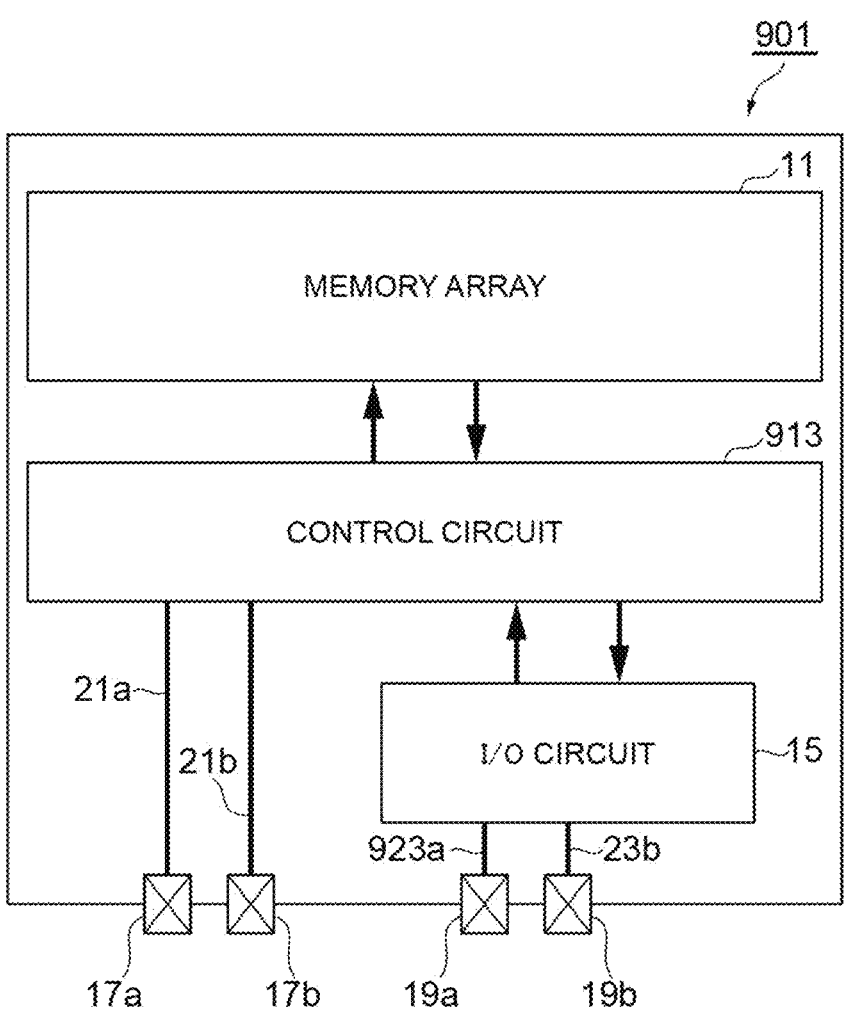
FIG. 6 is a diagram illustrating a schematic configuration of a NAND flash memory 901 according to a comparative example.
Figure 7:
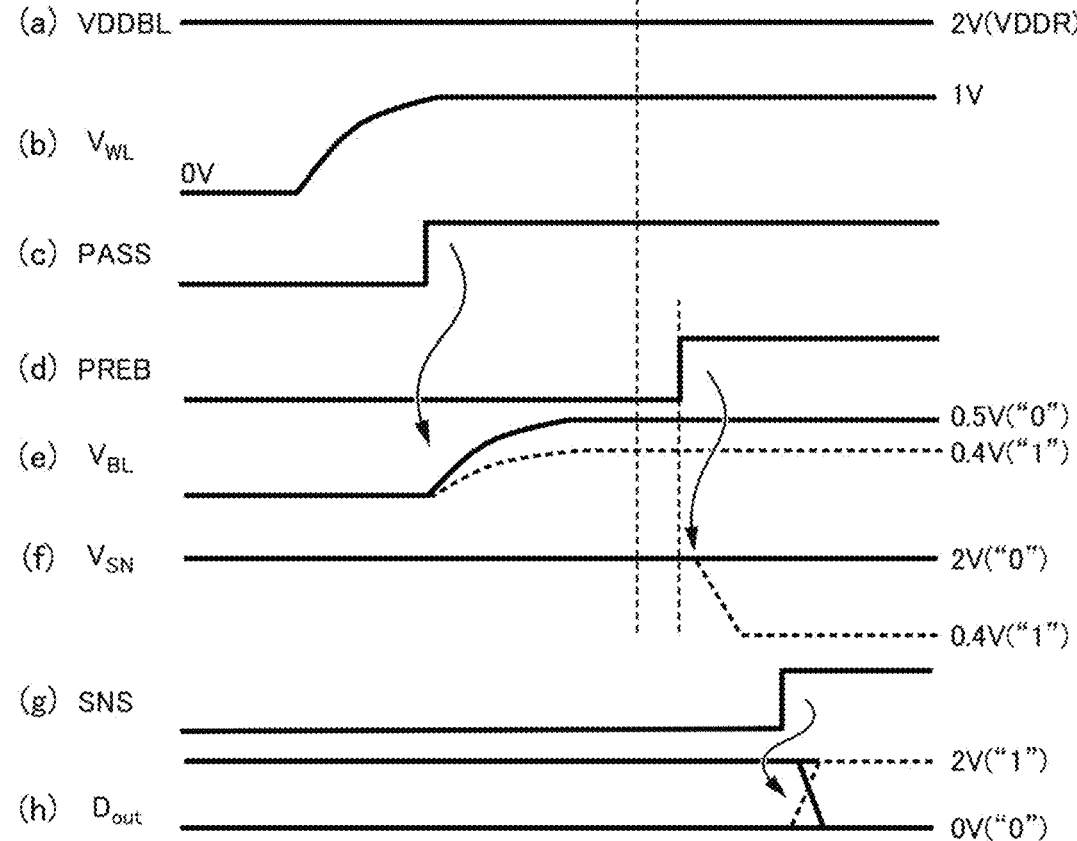
FIG. 7 is a timing chart illustrating changes in various voltage signals in a memory array 11 and a control circuit 913 at the time of a read operation of data in the NAND flash memory 901 of FIG. 6.

The effect of reducing power consumption in the present embodiment is evaluated in comparison with a comparative example. FIG. 6 is a diagram illustrating a schematic configuration of a NAND flash memory 901 according to the comparative example, FIG. 7 is a timing chart illustrating changes in various voltage signals in the memory array 11 and the control circuit 913 during a data read operation in the NAND flash memory 901, in which part (a) illustrates a temporal change in the potential VDDBL, part (b) illustrates a temporal change in the selection signal $V_{WL}$, part (c) illustrates a temporal change in the control signal PASS, part (d) illustrates a temporal change in the control signal PREB, part (e) illustrates a temporal change in the potential $V_{BL}$, part (f) illustrates a temporal change in the potential $V_{SN}$, part (g) illustrates a temporal change in the control signal SNS, and part (h) illustrates a temporal change in the data signal $D_{OUT}$. A difference between the NAND flash memory 1 according to the embodiment and the NAND flash memory 901 according to the comparative example is that the power supply terminal 19a is electrically connected only to the I/O circuit 15 via a wiring 923a, and only the I/O circuit 15 is configured to be powered by the first power supply. In the comparative example having such a configuration, the bit line BL is charged with a voltage of 2 V, which is the output voltage VDDR, according to the power supply by the second power supply at the time of the read operation of data (part (a) of FIG. 7), and the potential $V_{SN}$ of the sense node SN is maintained at the voltage of 2 V, which is the output voltage VDDR, until the amplification function of the potential $V_{BL}$ operates.

In the present embodiment and the comparative example, assuming that the parasitic capacitance $C_{BL}$=3 pF, the parasitic capacitance $C_{SN}$=0.1 pF, the first voltage VDDQ=1.2 V, and the second voltage VDD=3 V, the storage state of the data of the memory cell MC from which data is read is "1", and the consumed energy of one cycle of the read operation of data until the potential $V_{SN}$ of the sense node SN is returned to the voltage in the initial state when the read operation of data is completed is evaluated. In general, the consumed energy related to charging of the parasitic capacitance is evaluated by a value obtained by multiplying the charged charge amount by the supply voltage of the power supply. In the comparative example, a consumed energy $E_{BL}$ required for charging the bit line BL is calculated as $E_{BL}$=3 pF×0.5 V×3 V=4.5 pJ, a consumed energy $E_{SN}$ required for charging the read line RL is calculated as $E_{SN}$=0.1 pF×1.6 V×3 V=0.48 pJ, and a total consumed energy E is calculated as E=5.0 pJ. On the other hand, in the present embodiment, a consumed energy $E_{BL}$ required for charging the bit line BL is calculated as $E_{BL}$=3 pF×0.5 V×1.2 V=1.8 pJ, a consumed energy $E_{SN}$ required for charging the read line RL is calculated as $E_{SN}$=0.1 [pF]×(0.8 V×3 V+0.8 V×1.2 V)=0.34 pJ, and a total consumed energy E is calculated as E=2.1 pJ. From these calculation results, in the present embodiment, it is found that an energy reduction effect of about 60% can be obtained as compared with the comparative example, and the effect of reducing the entire consumed energy including the word line is estimated to be about 30%.

Furthermore, the amplification unit 33 includes the switching element 29 and the switching element 31, and the inverter 35 operates to sense the potential $V_{SN}$ of the sense node SN at the timing after the switching element 29 is turned off. According to such a configuration, the amplification unit 33 can be operated to charge the bit line BL until the potential $V_{BL}$ of the bit line BL reaches a predetermined value at the time of charging the bit line BL, and the inverter 35 can be operated to sense the potential $V_{SN}$ of the sense node SN in a state where power supply to the read line RL is stopped. As a result, the bit line BL can be charged until the storage state of the data of the memory cell MC can be determined, and the data of the memory cell MC can be stably determined based on the potential $V_{SN}$ obtained by amplifying the subsequent voltage of the bit line BL.

Furthermore, the switching element 29 is configured to be turned on/off according to the voltage of the bit line BL that changes corresponding to the storage state of the data of the memory cell MC connected to the bit line BL at the time of charging by the amplification unit 33. That is, a voltage having a value obtained by adding a threshold voltage to the voltage at the time of charging the bit line BL is applied to the gate of the switching element 29 during the read operation of data. With such a configuration, the bit line BL can be charged until the storage state of the data of the memory cell MC can be determined, and thereafter, the voltage of the bit line BL can be amplified in the sense node SN on the read line RL. As a result, the read operation of data can be stabilized. Furthermore, the control circuit 13 further includes the switching circuit 13b that switches the connection between the power supply line PL1 connected to the amplification unit 33 and the first power supply and the second power supply. In this case, the switching circuit 13b can be used to switch the power to be supplied to the amplification unit 33 between the first power supply and the second power supply. As a result, power consumption in the read operation of data of the control circuit 13 can be reduced with a simple circuit configuration.

Preferably, the switching circuit 13b includes the linear regulator 41 that is connected to the second power supply, converts the second voltage VDD into a predetermined voltage VDDR, and outputs the predetermined voltage VDDR, and switching elements 51 and 53 that switch the connection between the output of the first power supply and the output of the linear regulator 41, and the power supply line PL1. With this configuration, by using the switching circuit 13b, the power to be supplied to the amplification unit 33 can be switched between the first power supply and the second power supply, and the second voltage VDD of the second power supply can be converted into the predetermined voltage VDDR and supplied. As a result, the power consumption in the read operation of data of the control circuit 13 can be reduced with a simple circuit configuration, and the read operation of data can be stabilized.

The present invention is not limited to the above-described embodiment. The configuration of the above embodiment can be variously changed.

The above embodiment is not limited to storing binary (1-bit) data in the memory cell MC, and may operate to store multi-value (2-bit or more) data.

Furthermore, in the above embodiment, the current $I_{cell1}$ at the time of data "1" is configured to be larger than the current $I_{cell0}$ at the time of data "0" with respect to the normal current in the memory cell MC, but the current $I_{cell1}$ may be configured to be smaller than the current $I_{cell0}$.

Furthermore, in the NAND flash memory 1 according to the above embodiment, instead of the first power supply shared with the I/O circuit 15, a power supply having a voltage lower than the second voltage VDD and higher than a voltage (0.5 V in the present embodiment) at which the data of the bit line BL can be determined may be separately connected to the control circuit 13.

Furthermore, in the control procedure illustrated in FIG. 4, the switching of the potential VDDBL from the first voltage VDDQ to the output voltage VDDR by the switching circuit 13b may be controlled to be performed at a timing before the charging of the bit line BL is completed.

Furthermore, the control circuit 13 may execute the above-described read operation of data also during the write operation of data. That is, the control circuit 13 executes an operation similar to the read operation of data described above as a verify read operation for verifying the write operation after completion of the write operation of data to the memory cell MC. In this case, it is possible to further reduce power consumption in the control circuit 13.

Furthermore, in the control procedure illustrated in FIG. 4, the control circuit 13 does not necessarily need to switch the supply source of the potential VDDBL between the two power supplies, and may control the potential VDDBL to be constant at the first voltage VDDQ during the read operation of data. Even in this case, the power consumption in the read operation can be efficiently reduced.

Here, in the above embodiment, it is preferable that the first amplification unit amplifies the electric signal of the bit line on the basis of the power supplied from the second power supply after charging the bit line. Note that "after charging the bit line" as used herein also includes a case where power supplied from the first power supply is changed to power supplied from the second power supply in the middle of a period in which the bit line is charged.

In this case, when data is read from a memory cell selected from among the plurality of memory cells electrically connected to the bit line, the first amplification unit first charges the bit line via the read line on the basis of power supplied from the first power supply having the first voltage. Thereafter, the electric signal of the bit line is amplified by the first amplification unit at the sense node on the read line on the basis of power supplied from the second power supply having the second voltage higher than the first voltage. Moreover, the second amplification unit determines the data stored in the memory cell selected on the basis of the voltage of the sense node and outputs it as a determination signal. As a result, it is possible to reduce the power consumption consumed when charging the bit line until the storage state of the data of the memory cell can be determined, and it is possible to amplify the charged voltage of the bit line with a sufficient drive voltage, and as a result, it is possible to stabilize the read operation of data. As a result, it is possible to efficiently reduce the power consumption in the read operation while improving the reliability of the read operation of the data from the memory cell.

Furthermore, in the above embodiment, the parasitic capacitance of the read line is preferably smaller than the parasitic capacitance of the bit line. In this case, the power consumption at the time of charging the bit line in the read circuit can be effectively reduced according to the decrease in the first voltage. As a result, the power consumption in the read operation of data of the read circuit can be more efficiently reduced.

Furthermore, in the above embodiment, it is also preferable that the second switching element turns on/off the connection between the first power supply or the second power supply and the read line, and the second amplification unit senses the voltage of the sense node at the timing after the second switching element is turned off. According to such a configuration, the first amplification unit can be operated to perform charging until the electric signal of the bit line reaches a predetermined value at the time of charging the bit line, and the second amplification unit can be operated to sense the voltage of the sense node in a state where the power supply to the read line is stopped. As a result, the bit line can be charged until the storage state of the data of the memory cell can be determined, and the data of the memory cell can be stably determined based on the voltage obtained by amplifying the subsequent electric signal of the bit line.

Furthermore, in the above embodiment, it is also preferable that the first switching element is configured to be turned on/off according to the electric signal of the bit line that changes according to the storage state of the data of the memory cell connected to the bit line at the time of charging by the first amplification unit. With such a configuration, the bit line can be charged until the storage state of the data of the memory cell can be determined, and thereafter, the electric signal of the bit line can be amplified in the sense node on the read line. As a result, the read operation of data can be stabilized.

Furthermore, in the above embodiment, it is also preferable to further include the switching circuit that switches the connection between the power supply line connected to the first amplification unit and the first power supply and the second power supply. In this case, the power supply for supplying power to the first amplification unit can be switched between the first power supply and the second power supply by using the switching circuit. As a result, it is possible to reduce power consumption in the read operation of data of the read circuit with a simple circuit configuration.

Furthermore, in the above embodiment, it is also preferable that the switching circuit includes the linear regulator that is connected to the second power supply, converts the second voltage into a predetermined voltage, and outputs the predetermined voltage, and the switching element that switches the connection between the output of the first power supply and the output of the linear regulator, and the power supply line. With this configuration, the power supply for supplying power to the first amplification unit can be switched between the first power supply and the second power supply using the switching circuit, and the voltage of the second power supply can be converted into a predetermined voltage and supplied. As a result, the power consumption in the read operation of data of the read circuit can be reduced with a simple circuit configuration, and the read operation of data can be stabilized.

REFERENCE SIGNS LIST

1 NAND flash memory (memory system)
11 memory array
13 control circuit (read circuit)
13a main circuit unit
13b switching circuit
29 switching element (first switching element)
31 switching element (second switching element)
33 amplification unit (first amplification unit)
35 inverter (second amplification unit)
41 linear regulator
43 switching circuit
51, 53 switching element
BL bit line
$C_{BL}$, $C_{SN}$ parasitic capacitance
MC memory cell
SN sense node
PL1 power supply line
RL read line

The invention claimed is:

1. A read circuit configured to read data from a memory array including a plurality of bit lines, each of the bit lines being a line-shaped wiring section electrically connecting a plurality of memory cells, the read circuit comprising:
a first amplification unit including a read line, the read line being a line-shaped wiring section electrically connected to a selected bit line among the plurality of bit lines, and configured to amplify an electric signal of the selected bit line at a voltage of a sense node on the read line corresponding to the selected bit line after charging the selected bit line via the read line during a read operation of data stored in a selected memory cell connected to the selected bit line; and
a second amplification unit configured to output a determination signal that determines the data stored in the selected memory cell connected to the selected bit line and selected during the read operation based on the voltage of the sense node corresponding to the selected bit line, wherein
the first amplification unit includes a first switching element that is electrically connected between the selected bit line and the read line and is configured to be switched between an ON state and an OFF state in response to the electric signal of the selected bit line, and a second switching element that is configured to switch a connection between the read line and a first power supply or a second power supply,
the second switching element is configured to charge the selected bit line using power supplied from the first power supply having a first voltage,
the first switching element is configured to be switched between the ON state and the OFF state in response to power supplied from the second power supply having a second voltage higher than the first voltage, and
the read circuit further comprises
a switching circuit configured to switch a connection between a power supply line connected to the first amplification unit, and the first power supply and the second power supply.
2. The read circuit according to claim 1, wherein
the first amplification unit amplifies the electric signal of the selected bit line in response to power supplied from the second power supply after charging the bit line.
3. The read circuit according to claim 1, wherein
a parasitic capacitance of the read line is smaller than a parasitic capacitance of the bit line.
4. The read circuit according to claim 2, wherein
the second switching element is configured to switch a connection between the first power supply or the second power supply and the read line, and
the second amplification unit senses the voltage of the sense node at a timing after the second switching element is turned off.
5. The read circuit according to claim 1, wherein
the first switching element is configured to be switched between an ON state and an OFF state according to the electric signal of the bit line that changes corresponding to a storage state of data of the memory cell connected to the bit line during charging by the first amplification unit.
6. The read circuit according to claim 1, wherein
the switching circuit includes a linear regulator connected to the second power supply and configured to convert the second voltage into a predetermined voltage and output the predetermined voltage, and a switching element configured to switch a connection between an output of the first power supply and an output of the linear regulator, and the power supply line.
7. A memory system comprising:
the read circuit according to claim 1; and
the memory array including the plurality of memory cells electrically connected to the read circuit via a plurality of the bit lines.

* * * * *